(12) United States Patent
Sharma et al.

(10) Patent No.: US 8,313,964 B2
(45) Date of Patent: Nov. 20, 2012

(54) SINGULATION METHOD AND RESULTING DEVICE OF THICK GALLIUM AND NITROGEN CONTAINING SUBSTRATES

(75) Inventors: Rajat Sharma, Goleta, CA (US); Thomas M. Katona, Goleta, CA (US); Andrew Felker, Goleta, CA (US)

(73) Assignee: Soraa, Inc., Fremont, CA (US)

( * ) Notice: Subject to any disclaimer, the term of this patent is extended or adjusted under 35 U.S.C. 154(b) by 0 days.

(21) Appl. No.: 13/163,498

(22) Filed: Jun. 17, 2011

(65) Prior Publication Data

US 2011/0309373 A1    Dec. 22, 2011

Related U.S. Application Data

(60) Provisional application No. 61/356,478, filed on Jun. 18, 2010.

(51) Int. Cl.
*H01L 21/00* (2006.01)
(52) U.S. Cl. ............................. 438/33; 257/76
(58) Field of Classification Search ............... 438/33, 438/68, 113, 462; 257/E21.517
See application file for complete search history.

(56) References Cited

U.S. PATENT DOCUMENTS

| | | | |
|---|---|---|---|
| 5,764,674 A | 6/1998 | Hibbs-Brenner et al. |
| 6,501,154 B2 | 12/2002 | Morita et al. |
| 6,639,925 B2 | 10/2003 | Niwa et al. |
| 6,858,882 B2 | 2/2005 | Tsuda et al. |
| 6,936,488 B2 | 8/2005 | D'Evelyn et al. |
| 7,341,880 B2 | 3/2008 | Erchak et al. |
| 7,550,305 B2 | 6/2009 | Yamagata et al. |
| 7,816,238 B2 | 10/2010 | Osada et al. |
| 7,897,988 B2 | 3/2011 | Chen et al. |
| 2001/0048114 A1 | 12/2001 | Morita et al. |
| 2002/0105986 A1 | 8/2002 | Yamasaki |
| 2006/0213429 A1 | 9/2006 | Motoki et al. |
| 2006/0240585 A1 | 10/2006 | Epler et al. |
| 2006/0256482 A1 | 11/2006 | Araki et al. |
| 2007/0054476 A1 | 3/2007 | Nakahata et al. |
| 2008/0121916 A1 | 5/2008 | Teng et al. |
| 2008/0198881 A1 | 8/2008 | Farrell et al. |
| 2008/0285609 A1 | 11/2008 | Ohta et al. |
| 2008/0298409 A1 | 12/2008 | Yamashita et al. |
| 2009/0065798 A1 | 3/2009 | Masui et al. |
| 2009/0072252 A1 | 3/2009 | Son et al. |
| 2009/0081857 A1 | 3/2009 | Hanser et al. |
| 2009/0095973 A1 | 4/2009 | Tanaka et al. |
| 2009/0309110 A1 | 12/2009 | Raring et al. |
| 2009/0315965 A1 | 12/2009 | Yamagata et al. |

(Continued)

OTHER PUBLICATIONS

Farrell et al., 'Continuous-Wave Operation of AlGaN-Cladding-Free Nonpolar m-Plane InGaN/GaN Laser Diodes,' 2007, Japanese Journal of Applied Physics, vol. 46, No. 32, 2007, pp. L761-L763.

(Continued)

*Primary Examiner* — Julio J Maldonado
*Assistant Examiner* — Robert Bachner
(74) *Attorney, Agent, or Firm* — Kilpatrick Townsend & Stockton LLP

(57) ABSTRACT

A method for singulation of thick GaN wafers (e.g., 300-400 um) through the use of a double-side laser-scribe process. In a preferred embodiment, the patterned GaN substrate is processed using a laser-scribe on each side of the substrate to form scribe lines. The scribe lines are aligned to each other. In a preferred embodiment, the substrate has not been subjected to a thinning or polishing process for reducing its thickness.

15 Claims, 2 Drawing Sheets

Schematic side view diagram depicting breaking of the LED wafer depicted in fig. 1, after laser scribing on a first surface of the wafer and on the second surface of the wafer.

U.S. PATENT DOCUMENTS

| | | |
|---|---|---|
| 2010/0001300 A1 | 1/2010 | Raring et al. |
| 2010/0025656 A1 | 2/2010 | Raring et al. |
| 2010/0148145 A1 | 6/2010 | Ishibashi et al. |
| 2010/0219505 A1 | 9/2010 | D'Evelyn et al. |
| 2011/0056429 A1 | 3/2011 | Raring et al. |

OTHER PUBLICATIONS

Feezell et al., 'AlGaN-Cladding-Free Nonpolar InGaN/GaN Laser Diodes,' Japanese Journal of Applied Physics, vol. 46, No. 13, 2007, pp. L284-L286.

Haskell et al., 'Defect Reduction in (1100) m-plane gallium nitride via lateral epitaxial overgrowth by hydride vapor phase epitaxy', Applied Physics Letters 86, 111917 (2005), pp. 1-3.

Kojima et al., 'Stimulated Emission At 474 nm From an InGaN Laser Diode Structure Grown on A (1122) GaN Substrate,' Applied Physics Letters, vol. 91, 2007, pp. 251107-251107-3.

Kubota et al., 'Temperature Dependence of Polarized Photoluminescence From Nonpolar m-Plane InGaN Multiple Quantum Wells for Blue Laser Diodes,' Applied Physics Letter, vol. 92, 2008, pp. 011920-1-011920-3.

PCT Communication Including Partial Search and Examination Report for PCT/US2011/41106, dated Oct. 4, 2011, 2 pages total.

International Search Report for PCT application PCT/US2011/41106 (Jan. 5, 2012).

Tsuda et al., 'Blue Laser Diodes Fabricated on m-Plane GaN Substrates,' Applied Physics Express, vol. 1, 2008, pp. 011104-1-011104-3.

Tyagi et al., 'Semipolar (1011) InGaN/GaN Laser Diodes on Bulk GaN Substrates,' Japanese Journal of Applied Physics, vol. 46, No. 19, 2007, pp. L444-L445.

USPTO Office Action for U.S. Appl. No. 12/478,736 dated Feb. 7, 2012.

USPTO Office Action for U.S. Appl. No. 12/858,379 dated Apr. 14, 2011.

USPTO Notice of Allowance for U.S. Appl. No. 12/858,379 dated Dec. 6, 2011.

USPTO Notice of Allowance for U.S. Appl. No. 13/184,160 dated Dec. 12, 2011.

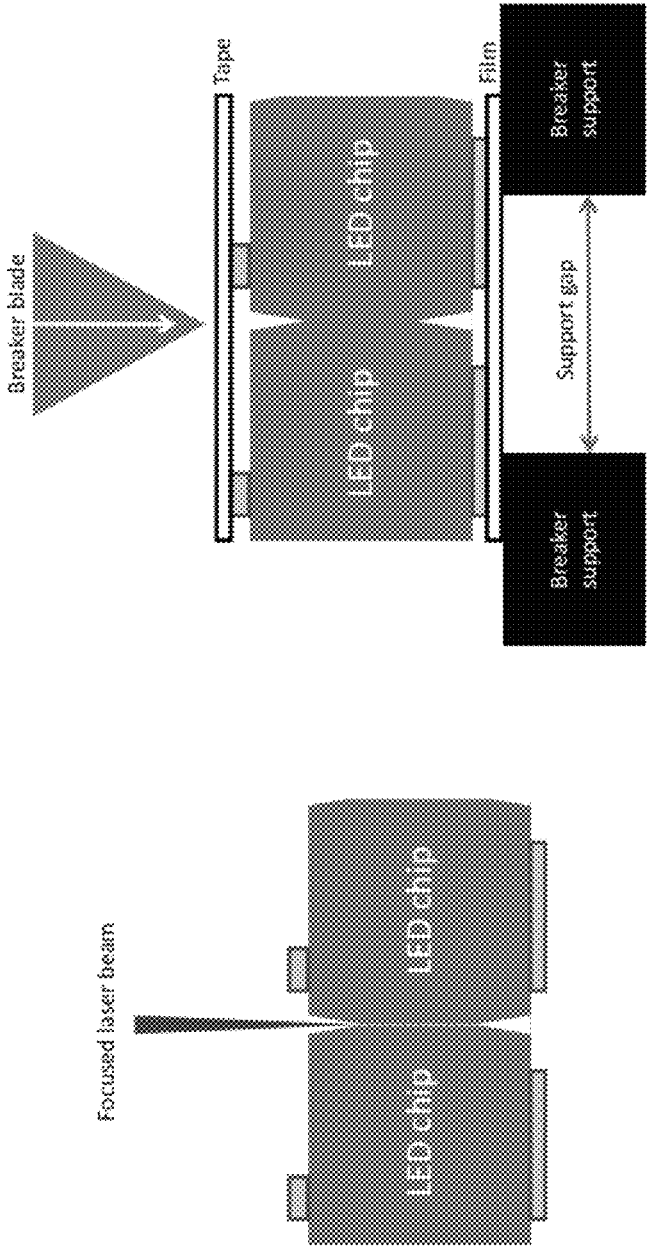

Schematic side-view diagram depicting breaking of the LED wafer depicted in Fig. 1, after laser scribing on a first surface of the wafer and on the second surface of the wafer.

US 8,313,964 B2

SINGULATION METHOD AND RESULTING DEVICE OF THICK GALLIUM AND NITROGEN CONTAINING SUBSTRATES

CROSS REFERENCE TO RELATED APPLICATION

This application claims priority to U.S. Provisional Application No. 61/356,478, filed Jun. 18, 2010, which is incorporated herein by reference for all purposes.

BACKGROUND OF THE INVENTION

The present invention relates generally to lighting techniques. More specifically, embodiments of the invention include techniques for manufacturing optical devices, such as light emitting diodes (LEDs) using a separation process of thick gallium and nitrogen containing substrates, such as GaN configured in non-polar or semi-polar crystalline orientations. The starting materials can include polar gallium nitride containing materials. The invention can be applied white lighting, multi-colored lighting, general illumination, decorative lighting, automotive and aircraft lamps, street lights, lighting for plant growth, indicator lights, lighting for flat panel displays, and other optoelectronic devices.

In the late 1800's, Thomas Edison invented the light bulb. The conventional light bulb, commonly called the "Edison bulb," has been used for over one hundred years. The conventional light bulb uses a tungsten filament enclosed in a glass bulb sealed in a base, which is screwed into a socket. The socket is coupled to an AC power or DC power source. The conventional light bulb can be found commonly in houses, buildings, and outdoor lightings, and other areas requiring light. Unfortunately, drawbacks exist with the conventional Edison light bulb. That is, the conventional light bulb dissipates much thermal energy. More than 90% of the energy used for the conventional light bulb dissipates as thermal energy. Additionally, the conventional light bulb routinely fails often due to thermal expansion and contraction of the filament element.

Solid state lighting techniques are known. Solid state lighting relies upon semiconductor materials to produce light emitting diodes, commonly called LEDs. At first, red LEDs were demonstrated and introduced into commerce. Red LEDs use Aluminum Indium Gallium Phosphide or AlInGaP semiconductor materials. Most recently, Shuji Nakamura pioneered the use of InGaN materials to produce LEDs emitting light in the blue color range for blue LEDs. The blue colored LEDs led to innovations such as solid state white lighting, the blue laser diode, which in turn enabled the Blu-Ray™ (trademark of the Blu-Ray Disc Association) DVD player, and other developments. Other colored LEDs have also been proposed.

High intensity UV, blue, and green LEDs based on GaN have been proposed and even demonstrated with some success. Efficiencies have typically been highest in the UV-violet, dropping off as the emission wavelength increases to blue or green. Unfortunately, achieving high intensity, high-efficiency GaN-based green LEDs has been particularly problematic. Additionally, GaN based LEDs have been costly and difficult to produce on a wide-scale in an efficient manner.

Conventional LED fabrication process typically employ a wafer scribing and breaking procedure to separate individual LED chips within a wafer. The wafers are typically thinned to ~100 um or less, and are typically laser- or diamond-scribed, on one side prior to dicing. Thinning often uses grinding and polishing techniques, which are time consuming and costly.

BRIEF SUMMARY OF THE INVENTION

The invention provides a method for singulation of thick GaN wafers (e.g., 300-400 um) through the use of a double-side laser-scribe process. In a preferred embodiment, the patterned GaN substrate is processed using a laser-scriber on each of the substrate surfaces to form scribe lines. The scribe lines are aligned to each other. The method is most useful on substrates not subjected to a thinning or polishing process for reducing a thickness of the substrate.

The invention provides a method for separating individual die from a substrate member comprising optical devices. The method includes providing a gallium and nitrogen containing substrate member having a plurality of optical devices, e.g., light emitting diodes, configured in an array. The substrate member has a front side and a back side. The method includes aligning a scribe device to scribe at least a street region on a portion of the front side between a first optical device and a second optical device and forming a first scribe line on the street region between the first optical device and the second optical device. The method also includes forming a second scribe line on a backside portion of the substrate member overlying the first scribe line while maintaining a thickness of the substrate member between the first scribe line and the second scribe line. Energy (e.g., mechanical, chemical, electrical,) is then applied to a portion of the substrate member to separate the first optical device from the second optical device.

In an alternative embodiment, the present invention provides a bulk GaN wafer with an overlying LED epitaxial structure and with p-type and n-type metallizations, fabricated such that there are 'scribe streets' separating individual LED devices on the wafer.

The LED wafer is laser-scribed within the 'scribe streets' on a first surface of the wafer, along one or more axes according to a specific embodiment. The scribe depth in the scribed regions on the first surface is typically 20-25% of the thickness of the LED wafer according to a specific embodiment. In a specific embodiment, the LED wafer is then flipped over, and is then laser-scribed within the 'scribe streets' on a second surface of the wafer, along one or more axes, taking care to ensure that the scribes on the second surface are aligned to be substantially overlying the scribes on the first side of the wafer. In other embodiments, scribe lines on one side may be aligned to scribe lines on the other side of the substrate In a specific embodiment, the scribe depth in the scribed regions on the second surface is typically 20-25% of the thickness of the LED wafer The scribed LED wafer is then broken using an anvil breaker setup. Breaking occurs along the planes defined by two aligned scribed regions on the two opposing sides of the wafer. In a specific embodiment, the present method allows for the singulation of thick GaN wafers, thereby eliminating the need for expensive and time-consuming lapping and polishing steps in the LED fabrication process.

The present method provides for the singulation of thick GaN wafers into individual LED chips with lateral chip dimensions that are significantly smaller than those enabled by standard single-sided scribe methods. In other embodiments, the present method provides higher process yields at the scribe and break process steps than conventional methods. Additionally, there is a reduced incidence of chip-outs, as well as doublets (pairs of chips that are not separated during the break step). In other embodiments, the scribed regions may induce surface roughening on the side-walls of the generated LED chips which may enhance light extraction from the chips when compared to chips generated by scribing on a single side. Still further, the invention provides a wafer that has a scribe regions on each side of the substrate.

Various benefits are achieved over pre-existing techniques using the present invention. In a specific embodiment, the present invention provides for a method for singulation of thick c-plane GaN wafers into triangle-shaped LED chips defined by three equivalent m-plane oriented sidewalls. The m-plane is a natural break plane which easily cleaves, in the case of c-plane GaN wafers, and therefore, a singulation process involving breaking exclusively or predominately along a set of m-plane orientations will have a higher yield than a process involving breaking along both m-plane orientations and a-plane orientations. The invention provides for triangle-shaped chips characterized by improved light extraction when compared to conventional square- or rectangle-shaped chips, due to an increase in the per-pass probability of escape of in-plane emission, arising from a decrease in the probability of total internal reflection at the sidewalls. Additionally, in-plane standing optical modes in the case of square- or rectangle-shaped chips may be absent in the case of triangle-shaped chips.

BRIEF DESCRIPTION OF THE DRAWINGS

FIG. 1 is a diagram depicting a laser scribing process for an optical device;

FIG. 2 is a diagram depicting a breaking process for an optical device; and

DETAILED DESCRIPTION OF THE INVENTION

Figure 3:
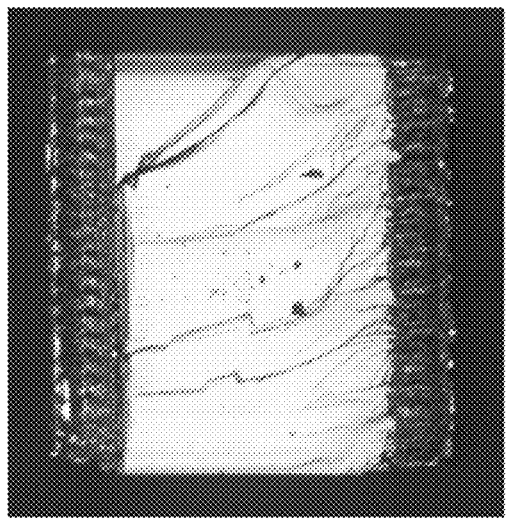
FIG. 3 is a diagram of a separated surface of an optical device.

FIG. 1 is a side-view diagram depicting a laser scribing process for an optical device according to an embodiment of the present invention. In a specific embodiment, the LED wafer is laser-scribed within the 'scribe streets' on a first surface of the wafer, along one or more axes according to a specific embodiment. In other embodiments, the scribing can occur using a saw, a diamond scribe, a chemical etchant (with or without a photo-assisted component), reactive ion or plasma etchant or milling, or combinations, and the like. The scribe depth in the scribed regions on the first surface is typically 20-25% of the thickness of the LED wafer according to a specific embodiment. In other embodiments, the scribe depth can vary and have other dimension. In a specific embodiment, the scribe line also has a suitable width and length Of course, there can be other variations, modifications, and alternatives.

In a specific embodiment, the LED wafer is then flipped over, and is then laser-scribed within the 'scribe streets' on a second surface of the wafer, along one or more axes, taking care to ensure that the scribes on the second surface are aligned to be substantially overlying the scribes on the first side of the wafer. In a specific embodiment, the scribe depth in the scribed regions on the second surface is typically 20-25% of the thickness of the LED wafer The scribed LED wafer is then broken using an anvil breaker setup, such as the one further described below.

FIG. 2 is a simplified side-view diagram depicting a breaking process for an optical device according to an embodiment of the present invention. As shown, breaking occurs along the planes defined by two aligned scribed regions on the two opposing sides of the wafer. In a specific embodiment, the present method provides for the singulation of thick GaN wafers, thereby eliminating the need for expensive and time-consuming lapping and polishing steps in the LED fabrication process.

In a specific embodiment, the present method provides for the singulation of thick GaN wafers into individual LED chips with lateral chip dimensions that are significantly smaller than those enabled by standard single-sided scribe methods. In other embodiments, the present method provides higher process yields at the scribe and break process steps than conventional methods. Additionally, there is a reduced incidence of chip-outs, as well as doublets (pairs of chips that are not separated during the break step). In other embodiments, the scribed regions may induce surface roughening on the side-walls of the generated LED chips which may enhance light extraction from the chips when compared to chips generated by scribing on a single side.

FIG. 3 is a side-view diagram of a separated surface of an optical device according to an embodiment of the present invention. This diagram is merely an example, which should not unduly limit the scope of the claims herein. One of ordinary skill in the art would recognize other variations, modifications, and alternatives. As shown, the separated surface demonstrates the present method.

In other embodiments, the method can also include other variations as described below.

1. The LED wafer may be a c-plane GaN wafer, m-plane GaN wafer, or a semipolar GaN wafer, or other single-crystalline wafer with an LED epitaxial structure overlying at least one surface of the wafer.

2. The LED wafer may be scribed on the two surfaces using a plurality of scribe methods, for example, laser scribing, diamond scribing, and sawing/dicing or others.

3. The scribe depth on one side of the LED wafer is between 0.5% and 99.5% of the thickness of the wafer.

4. The scribed regions may have continuous scribe lines, dashed scribe lines or dotted scribe lines. The scribed regions along axes may or may not intersect in the regions defined by intersecting 'scribe streets.'

5. Scribing may be performed along at least one 'scribe street' orientation on a first surface, and along at least one 'scribe street' orientation on the surface, such that at least two 'scribe street' orientations chosen are non-parallel.

6. The scribed LED wafer may be broken using a an anvil breaker, roller breaker or breaker bar.

While the above is a full description of the specific embodiments, various modifications, alternative constructions and equivalents may be used. The present specification describes specific surface orientations, but it would be recognized that any plane orientation can be used. The above description and illustrations should not be taken as limiting the scope of the present invention which is defined by the appended claims.

What is claimed is:

1. A method for separating individual die from a gallium and nitrogen containing substrate having a plurality of optical devices arranged in an array, the substrate member having a front side and a back side, the method comprising:

aligning a scribe device to scribe at least a street region on a portion of the front side between a first optical device and a second optical device;

forming a first scribe line on the street region between the first optical device and the second optical device;

forming a second scribe line on a backside portion of the substrate member and overlying the first scribe line while maintaining a thickness of the substrate member between the first scribe line and the second scribe line; and applying energy to a portion of the substrate member to separate the first optical device from the second optical device.

2. The method of claim 1 wherein the energy comprises a mechanical force.

3. The method of claim 1 wherein the substrate member has an initial thickness, the first scribe line has a first depth of about 20 to 25% of the initial thickness; and the second scribe line has a second depth of about 20 to 25% of the initial thickness.

4. The method of claim 1 wherein the first optical device has a first length, a first width, and an initial thickness greater than one of the first width or the first length.

5. The method of claim 4 wherein the initial thickness is greater than each of the first width or the first length.

6. The method of claim 1 wherein the initial thickness is from about 100 microns to about 500 microns.

7. The method of claim 1 wherein each of the optical devices includes a roughened edge surface.

8. The method of claim 1 wherein the scribe device is selected from a diamond scribe, a laser scribe, saw, chemical scribe, or dry etch scribe.

9. The method of claim 1 wherein the first scribe region is patterned.

10. The method of claim 1 wherein the first scribe region is continuous.

11. The method of claim 1 wherein the second scribe region is patterned.

12. The method of claim 1 wherein the second scribe region is continuous.

13. The method of claim 1 wherein the first scribe region and the second scribe region are offset.

14. The method of claim 1 wherein the first scribe is provided in a region overlying the second scribe.

15. A method as in claim 1 wherein the optical devices comprise light emitting diodes and the individual die comprises a single light emitting diode.

* * * * *